DOPING SEMICONDUCTORS WITH ELEMENTAL DOPANT IMPURITY

Filed March 15, 1968 2 Sheets-Sheet 1

INVENTORS
RICHARD C. G. SWANN
THOMAS P. CAUGE
BY [signature]
ATTORNEY

DOPING SEMICONDUCTORS WITH ELEMENTAL DOPANT IMPURITY

Filed March 15, 1968 2 Sheets-Sheet 2

INVENTORS
RICHARD C. G. SWANN
THOMAS P. CAUGE
BY
ATTORNEY

United States Patent Office 3,576,685
Patented Apr. 27, 1971

3,576,685

DOPING SEMICONDUCTORS WITH ELEMENTAL DOPANT IMPURITY

Richard C. G. Swann, Palo Alto, and Thomas P. Cauge, Mountain View, Calif., assignors to International Telephone and Telegraph Corporation, Nutley, N.J.

Filed Mar. 15, 1968, Ser. No. 713,412
Int. Cl. H01l 7/36, 7/54
U.S. Cl. 148—187 8 Claims

ABSTRACT OF THE DISCLOSURE

This invention provides a method of doping semiconductor material by decomposing a compound of the dopant material and depositing the elemental dopant material upon the semiconductor surface.

BACKGROUND OF THE INVENTION

The standard technique for doping semiconductor devices is by the deposition of a dopant material from a compound such as $BCl_3$, $BBr_3$, $P_2O_5$ and $POCl_3$ after the deposition of the dielectric oxide layer. However in the course of the decomposition process, there is deposited upon the semiconductor surface a glassy compound of the dopant material. This results in some deleterious effects such as staining which causes unwanted rectifying contacts or open leads. The prior art also requires operations performed in different apparatus for each step such as the dielectric deposition and impurity deposition.

It is an object of this invention to provide an impurity deposition process which will avoid staining.

It is another object to provide a process for producing a uniform layer of elemental dopant over the entire surface of a silicon wafer whereby subsequent heat treatment will give a large area uniformly doped, uniformly diffused region.

It is still another object to provide a process whereby both the dielectric and impurity deposition can be carried out in the same apparatus.

This object is achieved by introducing the semiconductor slice into a glow discharge apparatus and causing a reaction of two substances, such as ammonia and silicon hydride, to result in the formation of silicon nitride which deposits on the silicon slice. Subsequently, the impurity deposition is made by decomposing in the same glow discharge apparatus an impurity compound such as boron trichloride whereby the elemental impurity, boron, deposits on an exposed area of the silicon surface and diffuses therein.

DESCRIPTION OF THE INVENTION

The above-mentioned and other features and objects of this invention will become more apparent by reference to the following description taken in conjunction with the accompanying drawings, in which.

Figure 1:
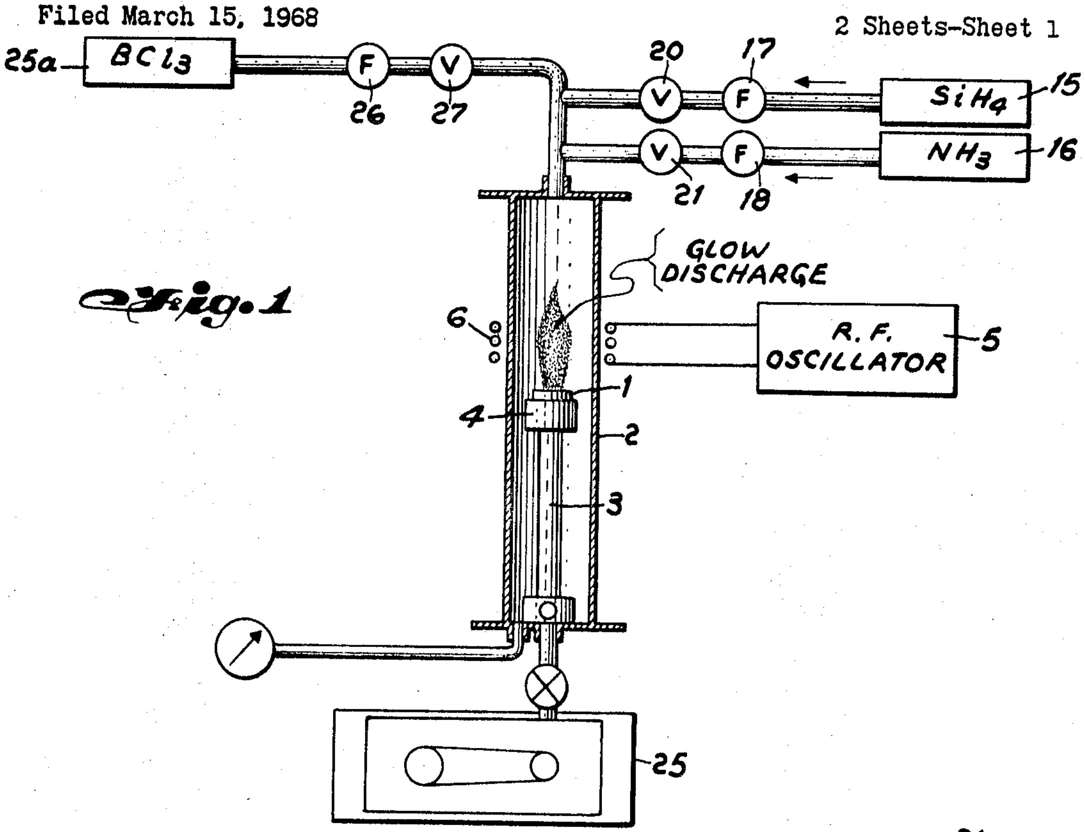
FIG. 1 is a view of the glow discharge apparatus used in our invention.

With reference to FIG. 1, there is shown the apparatus required for the practice of this invention: first the deposition of silicon nitride on a semiconductor substrate 1 and then a subsequent deposition of elemental boron on the substrate after windows have been opened in the silicon nitride, these two steps being done by the glow discharge method in the apparatus shown. The deposition of silicon nitride by reacting ammonia and silane in a radio frequency glow discharge process is described in the article by R. C. G. Swann, R. R. Mehta and T. P. Cauge entitled "The Preparation and Properties of Thin Film Silicon-Nitrogen Compounds Produced by a Radio Frequency Glow Discharge Reaction," Journal of the electrochemical Society, July 1967.

The apparatus is very simple requiring no internal electrodes, targets biasing or water cooling systems, as employed in sputtering systems. It comprises a silicon reaction tube 2 in which is disposed a quartz pedestal 3, on which is mounted a carbon susceptor 4. The output of a radio frequency oscillator 5 is coupled to a coil 6 disposed about the reaction tube 2. In operation at ambient or room temperature the carbon susceptor is removed. The generator can supply energy for both chemical reaction and substrate heating when desired.

The glow or "cold" discharge referred to occurs between the Townsend and the arc discharge which are only part of the family of electrical breakdown phenomena. Discharges can be further classified into two different types. The capacitive or "E" type discharge is excited by an electric field and the inductive or "H" type discharge is excited by a magnetic field. The latter is probably of greater significance in the system used for this work, as evidenced by incomplete chemical reactions in the case of high frequency capacitive discharges in the absence of internal electrodes.

The physical processes involved in a glow discharge are not simple, since they involve the interaction of positive ions, electrons, and excited molecules as well as the presence of neutral atoms and molecules. From a chemical standpoint, reaction products can be formed by the breaking of existing bonds, or the formation of new bonds, free radicals, and metastable ions. In the latter case, ions can even behave as catalysts by giving up their latent energy to associated molecules at the recombination sites. These sites can be the reaction tube walls or any object placed in the discharge which absorbs energy released by the recombinatioin. All these possible events indicate the complexity of plasma chemistry.

The chemical components of the silicon nitride are supplied from gaseous sources of undiluted silane 15 and anhydrous ammonia 16 having the following purities—silane 99% $+1\%H_2$ and anhydrous ammonia 99.99%. The flow rates are monitored through flow meters 17 and 18 in conjunction with regulating valves 20 and 21. The gases are mixed and fed into the reaction tube 2 which is continuously evacuated to pressures in the $10^{-1}$ torr range by means of vacuum pump 25. The basic reaction is as follows:

$$3SiH_4+4NH_3=Si_3N_4+12H_2 \qquad (1)$$

The silicon substrate, as an example, is N type of 2Ω cm. resistivity. After the silicon nitride film is deposited, the slice is removed from the reaction tube and chrome/gold layers are evaporated onto the silicon nitride. One of the main problems with silicon nitride is the difficulty of etching it and various attempts have been made to develop photo-etching methods. These methods have the drawback of being complicated and very different from the processes currently used for etching $SiO_2$. The only chemicals known to preferentially etch $Si_3N_4$ films are hydrofluoric acid and boiling phosphoric. Depending on how the nitride is deposited, etch rates varying from 75 A./min. to 1200 A./min. occur. The use of a conventional photoresist, e.g. KPR, KMER or KFTR is not practical because of lifting or decomposition of the photoresist film. By using the chrome-gold evaporated layers one can use strong reagents and long etching times and obtain a definition comparable to that obtained using KPR on $SiO_2$.

There is first evaporated on the silicon nitride layer about 1000 A. of chromium and then about 1000–4000 A. of pure gold. A suitable photoresist, such as KPR is applied over the chrome-gold. The photoresist is removed from the areas to be etched. Gold etching is accomplished by using a $KI_3$ solution and immediately thereafter the chromium is etched using concentrated HCl. The photoresist is then removed from the chrome-gold. The slice is now ready to be etched in 49% hydrofluoric acid. After the hydrofluoric acid etch, the chrome-gold layers are removed as above.

The slice is now ready for boron deposition. The slice is put back on the susceptor 4 and the boron trichloride from source 25 is turned on through flowmeter 26 and valve 27 into the reaction tube 2. The following reaction due to the radio frequency glow discharge occurs:

$$2BCl_3 \rightarrow 2B + 3Cl_2 \quad (2)$$

After the deposition of the elemental boron, the drive-in process at a temperature of 1200° C. can be performed in the standard diffusion furnace or in the glow discharge chamber 2. If performed in the glow discharge chamber, the quartz pedestal 3 is raised until the susceptor 4 and the silicon slice are in the RF field; the application of the RF voltage will raise the temperature of the slice to the required 1200° C. for drive-in.

Figure 2:
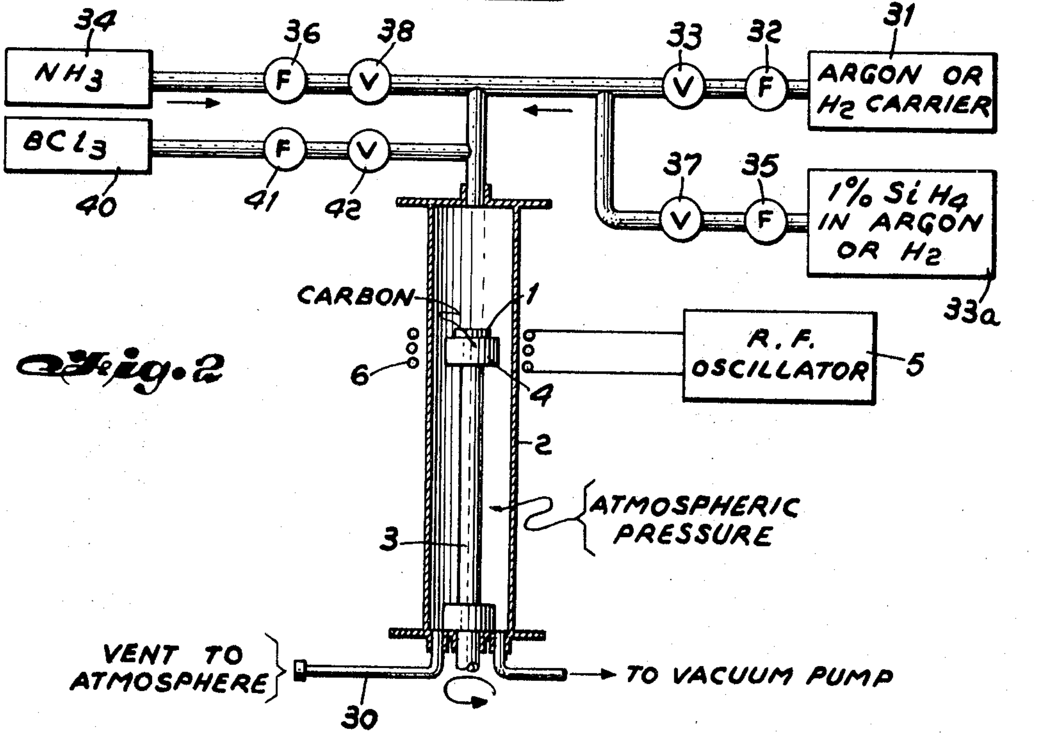
FIG. 2 is a view of the apparatus used for pyrolytic deposition.

An alternative method to the glow discharge method of silicon nitride deposition is the pyrolytic deposition process. With reference to FIG. 2, there is shown the chamber 2 with the quartz pedestal 3 and carbon susceptor 4. The carbon susceptor 4 with the silicon slice 1 is within the RF field, and is heated therein to a temperature of 900° C. The chamber is maintained at atmospheric pressure by means of the vent 30. The pedestal is rotated by any suitable means (not shown). A source 31 of argon or hydrogen is coupled to the chamber through flow meter 32 and regulating valve 33. The silane in a carrier gas of argon or hydrogen is supplied from source **33*a* and the anhydrous ammonia from source 34. These sources are controlled by flowmeters 35 and 36 and regulating valves 37 and 38. The argon is first introduced at atmospheric pressure for ten minutes to heat the substrate 1**. Then the silane and anhydrous ammonia are introduced at a ratio of 1:10. The pyrolytic silicon nitride is deposited to a thickness of 1200 A.–1500 A. at 900° C. The slice is then removed for evaporation of the chrome/gold layers sequentially (about 1000 A. each). The required windows are etched in the chrome/gold and then in the silicon nitride layer in accordance with the process described above.

The slice is then placed back into the chamber which is now evacuated and the $BCl_3$ from source 40 is introduced via the meters 41 and 42 into the chamber, and a layer of the elemental boron is deposited over the surface of the slice from the glow discharge at room temperature at a pressure of $10^{-1}$ torr for about 15 minutes. The "Drive-in" can be done in the chamber 2 at 1200° C. for 20 minutes or the slice can be transferred to a furnace and held there at 1200° C. for 20 minutes.

Figures 3, 4:
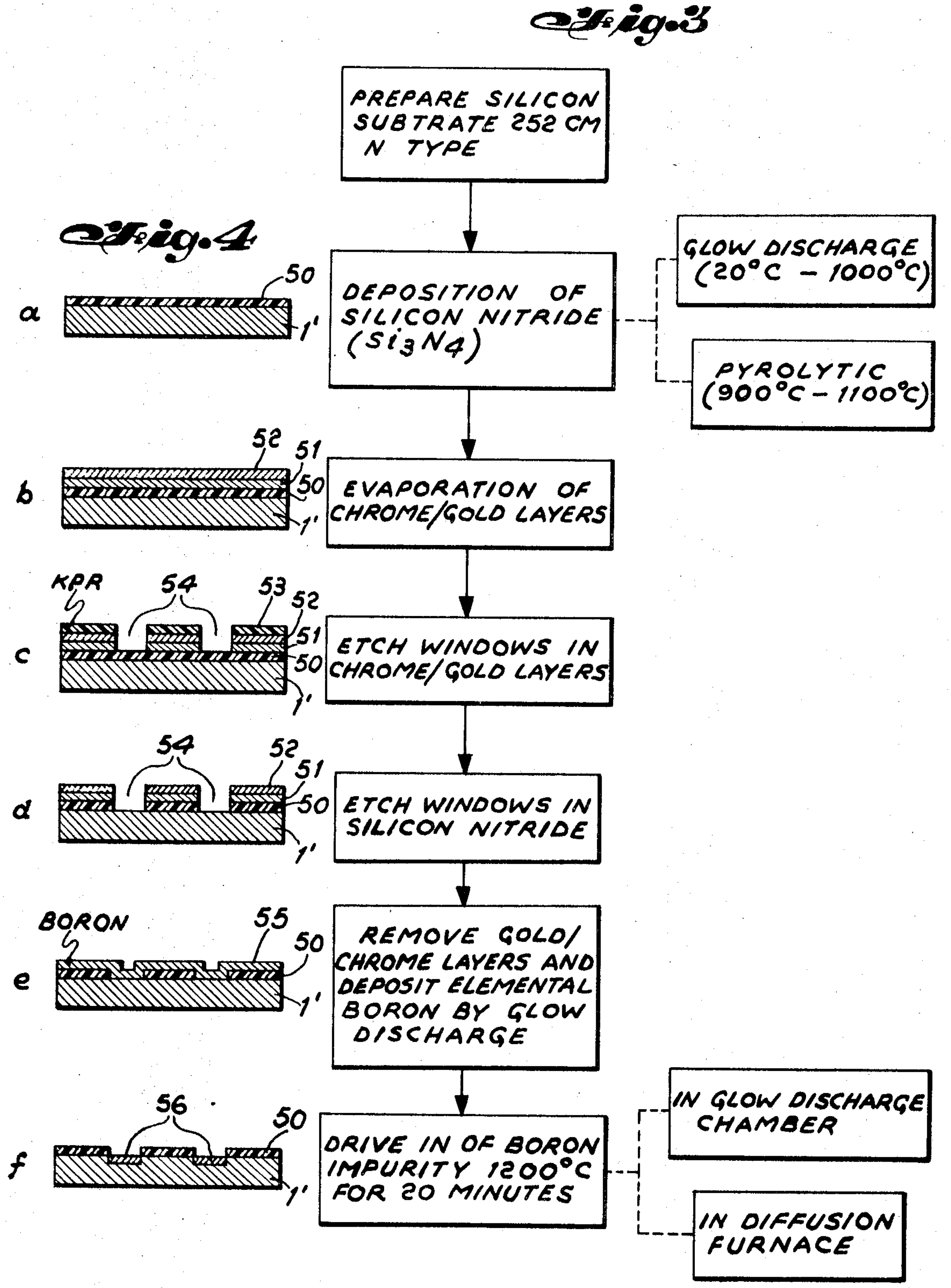
FIG. 3 is a flow chart of the process of this invention.
FIG. 4 shows the semiconductor slice at different stages of the process.

FIG. 4 shows the substrate at various stages of the process. The silicon substrate 1' has deposited thereon the silicon nitride layer 50; in FIG. 4*b* the chrome/gold layers 51 and 52 have been evaporated on the silicon nitride layer 50. In FIG. 4*c* the KPR 53 has been deposited and windows 54 have been etched in the KPR-chrome/gold layers; subsequently, the windows 54 are extended into the silicon nitride layer 50 down to the silicon surface. Then the KPR gold/chrome layers are removed and a layer of elemental boron 55 is deposited over the entire surface as shown in FIG. 4*e*. After the drive-in step, the boron 55 has diffused into the silicon to form a boron doped silicon region 56.

Elemental phosphorus can be deposited on the silica substrate in exactly the same manner as described for the deposition of elemental boron. Instead of boron trichloride phosphine ($PH_3$) is placed in source 25 or source 40 and the temperatures are the same. The reaction is as follows:

$$PH_3 \rightarrow P + 3H$$

Examples of other "P" type doping materials which can be used in the process of this invention are diborane ($B_2H_6$), aluminum alkyl $Al(C_2H_5)_3$ and digallane ($Ga_2H_6$). Examples of other "N" type doping substances are arsine ($AsH_3$) and stibine ($SbH_3$).

This process provides high surface concentrations such as greater than $10^{19}$ cm.$^{-3}$ for boron and uniformly doped large area junctions and uniform junction depths across a large area.

While we have described above the principles of our invention in connection with specific apparatus, it is to be clearly understood that this description is made only by way of example and not as a limitation to the scope of our invention as set forth in the objects thereof and in the accompanying claims.

We claim:

1. A process for introducing an elemental dopant impurity in semiconductor material comprising the steps of:
- depositing a dielectric layer upon one surface of a slice of semiconductor material;
- depositing a layer of chromium and a layer of gold over said dielectric layer;
- opening a window in said dielectric material and said chromium and gold layers at desired places to expose the semiconductor surface thereof;
- decomposing a compound of said elemental dopant impurity to deposit said elemental dopant impurity upon the surface of said slice; and
- subjecting said slice and said dopant impurity to heat to drive said elemental dopant impurity into said semiconductor material at the exposed areas.

2. A process according to claim 1 wherein said semiconductor material is silicon and said dielectric layer is silicon nitride.

3. A process according to claim 2 wherein said silicon nitride layer is formed by glow discharge from ammonia and silicon hydride.

4. A process according to claim 1 comprising the further step of subjecting said semiconductor material and said elemental dopant to heat at a temperature of 1200° C. to diffuse said dopant to a desired depth into said semiconductor material.

5. A process according to claim 4 wherein said heat is produced by induction heating in glow discharge apparatus.

6. A process according to claim 4 wherein said heat is produced in a diffusion furnace.

7. A process according to claim 1 wherein said elemental dopant is boron and said compound is boron trichloride and said decomposition is caused by glow discharge.

8. A process according to claim 1 wherein said elemental dopant is phosphorus and said compound is phosphine and said decomposition is caused by glow discharge.

(References on following page)

References Cited

UNITED STATES PATENTS

| | | | |
|---|---|---|---|
| 3,135,638 | 6/1964 | Cheney et al. | 156—11 |
| 3,193,418 | 7/1965 | Cooper et al. | 148—187 |
| 3,228,812 | 1/1966 | Blake | 148—187 |
| 3,386,909 | 6/1968 | Hough | 204—164 |
| 3,424,661 | 1/1969 | Androshuk et al. | 117—93.1 |
| 3,432,920 | 3/1969 | Rosenzweig | 148—187 |
| 3,437,533 | 4/1969 | Dingwall | 148—187 |
| 3,438,884 | 4/1969 | Juhola et al. | 117—93.1 |
| 3,441,454 | 4/1969 | Shaikh | 148—188 |
| 3,472,689 | 10/1969 | Scott, Jr. | 117—212 |
| 3,479,237 | 11/1969 | Bergh et al. | 148—187 |

L. DEWAYNE RUTLEDGE, Primary Examiner

R. A. LESTER, Assistant Examiner

U.S. Cl. X.R.

117—93, 212, 215; 148—1.5, 188; 204—164, 177